United States Patent
Zhao (12)

(10) Patent No.: US 6,211,561 B1
(45) Date of Patent: Apr. 3, 2001

(54) INTERCONNECT STRUCTURE AND METHOD EMPLOYING AIR GAPS BETWEEN METAL LINES AND BETWEEN METAL LAYERS

(75) Inventor: Bin Zhao, Irvine, CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 09/193,499

(22) Filed: Nov. 16, 1998

(51) Int. Cl.$^7$ ...................................... H01L 29/00
(52) U.S. Cl. .................. 257/522; 257/619; 257/758; 257/760
(58) Field of Search ..................... 257/508, 522, 257/619, 635, 637, 639, 640, 758, 760

(56) References Cited

U.S. PATENT DOCUMENTS

| | | | | |
|---|---|---|---|---|
| 5,668,398 | * | 9/1997 | Havemann et al. ................. | 257/522 |
| 5,711,987 | * | 1/1998 | Bearinger et al. ................. | 427/7 |
| 5,750,415 | * | 5/1998 | Gnade et al. ................. | 437/195 |
| 5,751,056 | * | 5/1998 | Numata ................. | 257/666 |
| 5,923,074 | * | 7/1999 | Jeng ................. | 257/522 |
| 6,054,769 | * | 4/2000 | Jeng ................. | 257/758 |
| 6,057,224 | * | 5/2000 | Bothra et al. ................. | 438/619 |
| 6,059,553 | * | 5/2000 | Jin et al. ................. | 421/387 |
| 6,087,729 | * | 7/2000 | Cerofolini et al. ................. | 257/760 |

\* cited by examiner

*Primary Examiner*—Olik Chaudhuri
*Assistant Examiner*—Ginette Peralta
(74) *Attorney, Agent, or Firm*—Snell & Wilmer, L.L.P.

(57) ABSTRACT

An interconnect structure and fabrication method are provided to form air gaps between interconnect lines and between interconnect layers. A conductive material is deposited and patterned to form a first level of interconnect lines. A first dielectric layer is deposited over the first level of interconnect lines. One or more air gaps are formed in the first dielectric layer to reduce inter-layer capacitance, intra-layer capacitance or both inter-layer and intra-layer capacitance. At least one support pillar remains in the first dielectric layer to promote mechanical strength and thermal conductivity. A sealing layer is deposited over the first insulative layer to seal the air gaps. Via holes are patterned and etched through the sealing layer and the first dielectric layer. A conductive material is deposited to fill the via holes and form conductive plugs therein. Thereafter, a conductive material is deposited and patterned to form a second level of interconnect lines.

44 Claims, 9 Drawing Sheets

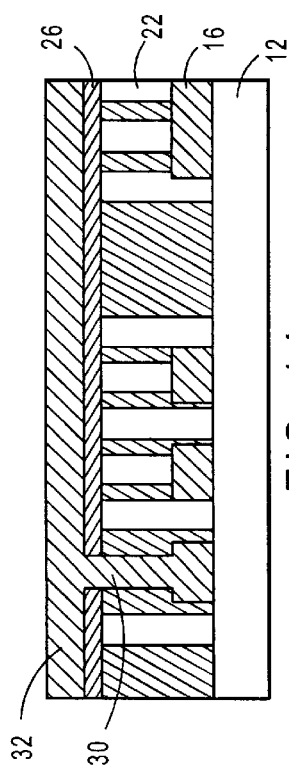
FIG. 14
FIG. 15
FIG. 16
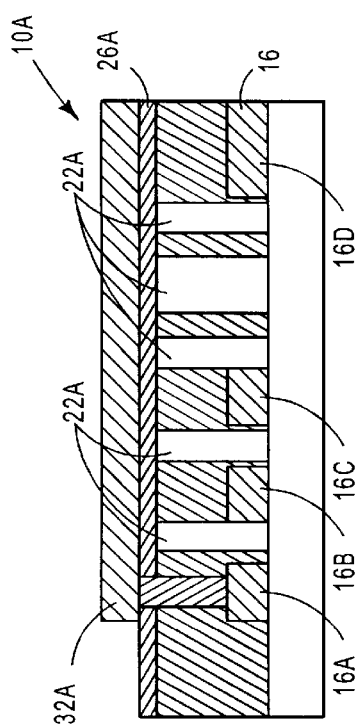
FIG. 17
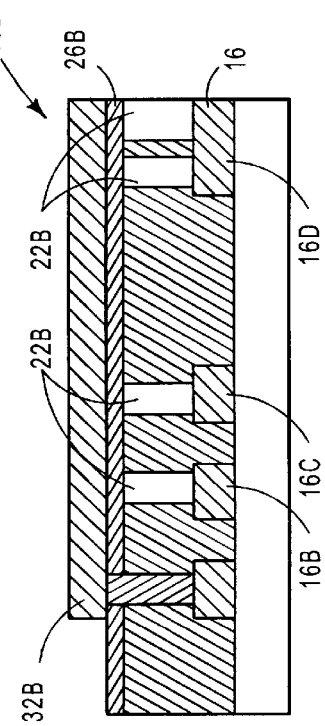
FIG. 18

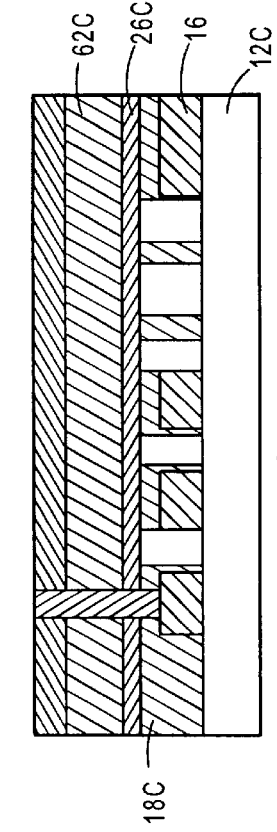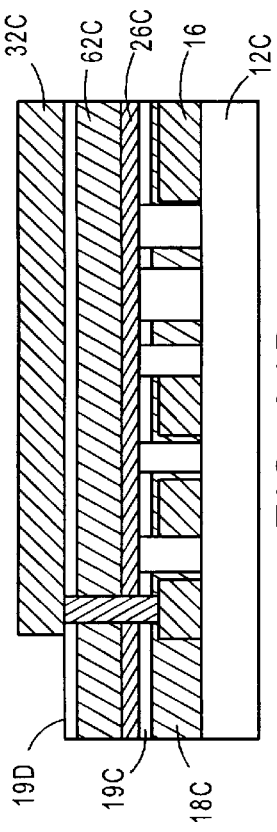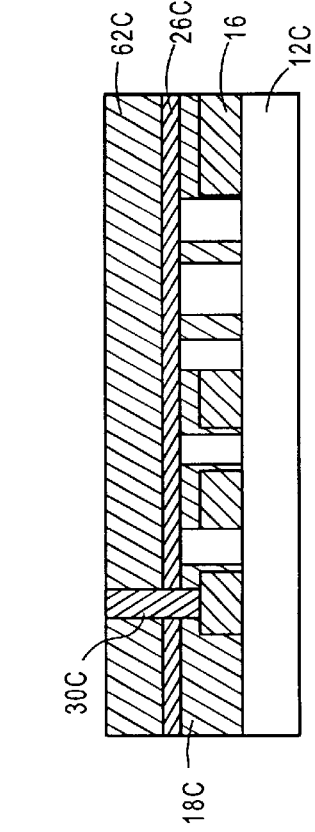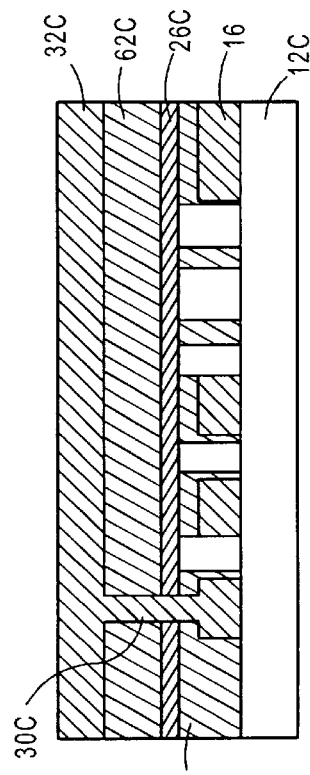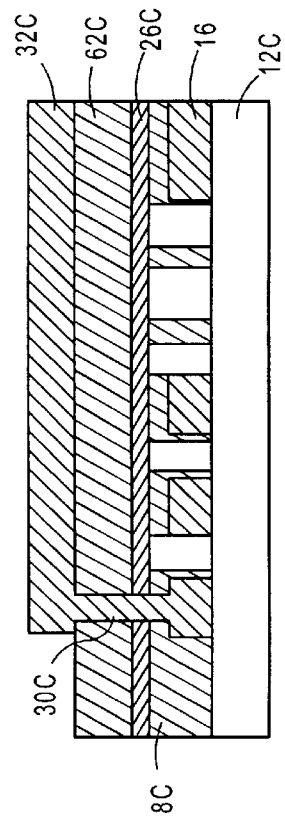

INTERCONNECT STRUCTURE AND METHOD EMPLOYING AIR GAPS BETWEEN METAL LINES AND BETWEEN METAL LAYERS

FIELD OF THE INVENTION

The present invention relates generally to semiconductor processing. More specifically, this invention relates to a novel interconnect structure and method for forming integrated circuits having air gaps between interconnect lines and between interconnect layers.

BACKGROUND OF THE INVENTION

Those involved with the manufacture of high performance ultra-large scale integration (ULSI) integrated circuits must address and be sensitive to RC delay problems, cross-talk issues, and power dissipation.

RC delay is the propagation delay of a signal caused by resistance in metal lines and the capacitance between metal lines and between metal layers. RC delay is undesirable because this delay adversely affects timing requirements and the performance of the circuit design by injecting uncertainty as to when a signal will be received or valid at a particular node in the circuit. Cross-talk is the signal interference between metal lines that can adversely affect signal integrity and signal strength. Power dissipation is the dynamic power drained by unwanted capacitance charge and discharge in a circuit.

It is apparent that RC delay problems, cross-talk issues, and power dissipation stem mainly from interconnect intra-layer capacitance (i.e., capacitance between metal lines within a metal layer) and interconnect inter-layer capacitance (i.e., capacitance between metal layers). Accordingly, reducing the line-to-line (i.e., intra-layer) capacitance and inter-layer capacitance is important in reducing RC delay, cross-talk, and power dissipation in a circuit.

One approach to reduce interconnect capacitance is to utilize low dielectric constant materials (commonly referred to as "low-k" materials) in interconnect structures. Since capacitance between metal lines or layers depends directly on the dielectric constant of the material therebetween, reducing the dielectric constant reduces the capacitance. Porous materials, such as Xerogel, show promise as candidates for the low-k material because of its good thermal stability, low thermal expansion coefficient, and low dielectric constant. Unfortunately, the use of these porous materials has several disadvantages.

First, the deposition of porous materials is complicated and difficult to control. Second, the porous materials generally provide poor mechanical strength. Third, the porous materials generally provide poor thermal conductivity. Fourth, because of the porous nature of these materials, defining via holes or trenches with smooth vertical walls and bottom surfaces therein is a difficult, if not impossible, challenge. Smooth vertical walls and bottom surfaces facilitate the deposition of a continuous liner in subsequent process steps. A continuous liner is important because a non-continuous liner causes poor metal fill in the via holes or trenches that can lead to reliability problems and failure of the connection.

Another approach to reduce interconnect capacitance is to introduce air spaces between metal lines by intentionally poor-filling the gaps between the metal lines when depositing dielectric material between the metal lines. However, this approach suffers from several disadvantages. First, it is not possible to control the location of these air spaces since the location of these spaces is determined by the interconnect layout. Second, this approach does not address inter-layer capacitance since poor-filling only forms air spaces between metal lines and not between metal layers. Third, this approach goes against the principle of completely filling gaps between metal lines for better process robustness and reliability. Fourth, it is not possible to control the volume of these air spaces, since the volume of these spaces is determined by the interconnect layout. Fifth, the air volume of these gaps is usually low, resulting in relatively large effective dielectric constant, which results in higher capacitance between metal lines.

Based on the foregoing, there remains a need for an improved interconnect structure that has a low effective dielectric constant and that overcomes the disadvantages discussed previously.

SUMMARY OF THE INVENTION

It is an object of the present invention to provide an improved interconnect structure that reduces parasitic capacitance between interconnect lines (i.e., line-to-line or intra-layer capacitance).

It is a further object of the present invention to provide an improved interconnect structure that reduces parasitic capacitance between interconnect layers (i.e., inter-layer capacitance).

It is a further object of the present invention to provide an improved interconnect structure that has a low effective dielectric constant.

It is yet another object of the present invention to provide an improved interconnect structure that can be manufactured in a feasible manner.

It is a further object of the present invention to provide a method of manufacturing an improved interconnect structure that allows one to precisely control the locations of air gaps or spaces between interconnect lines or interconnect layers.

It is another object of the present invention to provide a method of manufacturing an improved interconnect structure that is easy to integrate into many different process technologies.

It is yet another object of the present invention to provide an improved interconnect structure that provides increased mechanical strength, as compared to interconnect structures that employ porous materials.

It is another object of the present invention to provide an improved interconnect structure that provides improved thermal conductivity characteristics, as compared to interconnect structures that employ porous materials.

It is a further object of the present invention to provide an improved interconnect structure that provides a more stable effective dielectric constant over temperature than interconnect structures that employ porous materials.

These and other advantages will be apparent to those skilled in the art having reference to the specification in conjunction with the drawings and claims.

In order to accomplish the objects of the present invention, interconnect structures that reduce intra-layer capacitance, reduce inter-layer capacitance, or reduce both intra-layer and inter-layer capacitance are provided. The improved interconnect structures and fabrication methods employ air gaps or spaces between interconnect lines and between interconnect layers. A first conductive layer is deposited and etched to form a first interconnect layer of interconnect lines. A first insulative layer is deposited over the first interconnect layer. One or more air gaps are formed only between interconnect lines in a first interconnect layer, only between interconnect layers (e.g., between a first interconnect layer and a second interconnect layer), or between both interconnect lines in a first interconnect layer and between interconnect layers. A sealing layer is deposited over the first insulative layer to seal the air gaps. Via holes are patterned and etched through the sealing layer and first insulative layer. A conductive material is deposited to fill the via holes and form conductive plugs therein. A second conductive layer is deposited and patterned to form a second interconnect layer of interconnect lines.

BRIEF DESCRIPTION OF THE DRAWINGS

The present invention is illustrated by way of example, and not by way of limitation, in the figures of the accompanying drawings. Corresponding numerals and symbols in the different figures refer to corresponding parts unless otherwise indicated.

FIGS. 14–16 are sectional views illustrating an alternative approach to form plugs and a second interconnect layer utilizing a single metal deposition step for the first embodiment.

FIG. 17 is a cross sectional view of an interconnect structure according to a second embodiment of the present invention that reduces only intra-layer capacitance.

FIG. 18 is a cross sectional view of an interconnect structure according to a third embodiment of the present invention that reduces only inter-layer capacitance.

FIGS. 19–31B are cross sectional views of the interconnect structure of a fourth embodiment of the present invention after selected stages of fabrication.

FIGS. 32–33 are cross sectional views illustrating an alternative approach to form plugs and a second interconnect layer utilizing a single metal deposition step for the fourth embodiment.

DETAILED DESCRIPTION OF THE PREFERRED EMBODIMENT

Improved interconnect structures and methods of fabrication are described. In the following detailed specification, numerous specific details are set forth, such as materials, thicknesses, processing sequences, etc., in order to provide a thorough understanding of the present invention. However, it will be apparent to one skilled in the art that the present invention may be practiced without these specific details. In certain instances, well-known semiconductor manufacturing processes, materials, and equipment have not been described in detail in order to avoid unnecessarily obscuring the present invention.

The present invention is described in connection with interconnect structures and the methods to manufacture them. The first embodiment illustrates an interconnect structure having air gaps disposed between interconnect lines of the same layer and between interconnect layers. The second embodiment illustrates an interconnect structure having air gaps disposed only between interconnect lines of the same layer and not between interconnect layers. The third embodiment illustrates an interconnect structure having air gaps disposed only between interconnect layers and not between interconnect lines of the same layer. The fourth embodiment illustrates an interconnect structure having a second dielectric layer. The fourth embodiment can be utilized to form an interconnect structure having two different dielectric materials, such as $SiO_2$ and low-k materials. The fifth embodiment illustrates an interconnect structure having a second dielectric layer that acts to protect layers below it and to simplify the processing requirements for subsequent processing steps. However, it will be understood by those of ordinary skill in the art, that the present invention can also be readily implemented into other processes and interconnect structures.

Figure 1A:
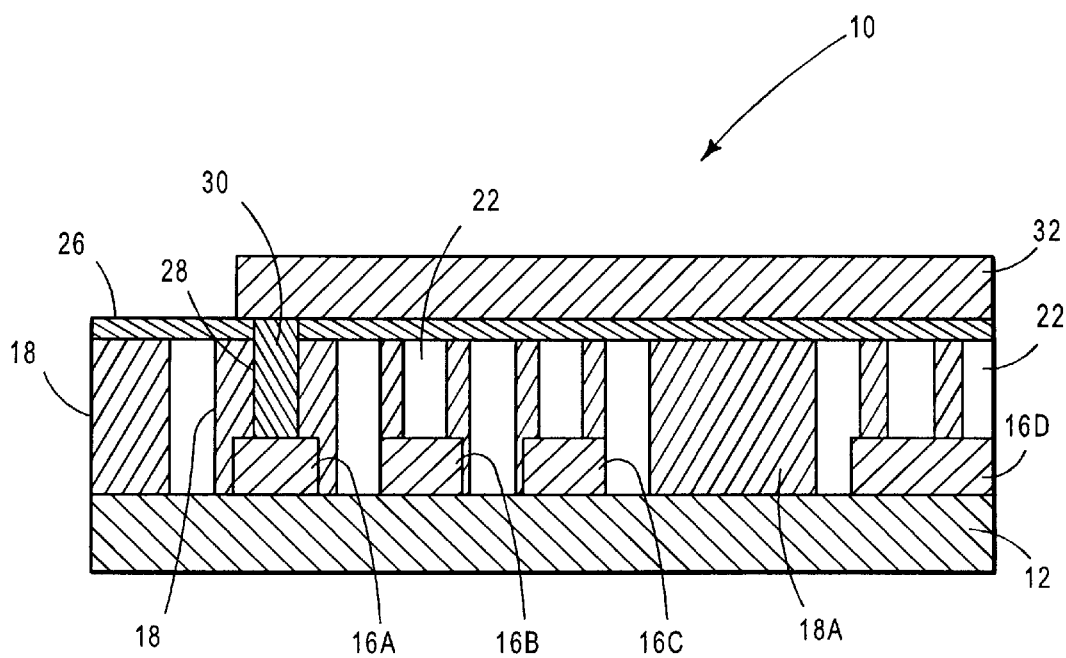
FIGS. 1A and 1B are cross sectional views of an interconnect structure according to a first embodiment of the present invention.

FIG. 1A is a vertical cross sectional view of a novel interconnect structure 10 formed on a layer 12 according to a first embodiment of the present invention. Layer 12 can be a semiconductor substrate formed from a semiconductor material, such as silicon or gallium arsenide (GaAs), or a dielectric layer formed from an insulative material. When layer 12 is a substrate, layer 12 can include transistors, diodes, and other semiconductor devices that are well known in the art. When layer 12 is a dielectric layer, layer 12 can contain vias or contacts (not shown) for providing an electrical connection between interconnect lines 16 and lower structures (not shown) of the integrated circuits.

A first conductive layer 16 is deposited over layer 12 and patterned to form interconnect lines 16a–16d. A patterned conductive layer is referred to also as an interconnect layer. After the first conductive layer 16 is patterned, a plurality of interconnect lines 16, separated by spaces 17 (see FIG. 2), remain. These spaces or trenches 17 are referred to hereinafter as interconnect line separating spaces 17. A dielectric is deposited to form dielectric layer 18 that gap-fills the spaces 17 between interconnect lines 16 to isolate the interconnect lines 16 from each other. One or more air gaps 22 are formed in dielectric layer 18 to reduce the effective dielectric constant of the dielectric layer 18 (as compared to the dielectric constant of layer 18 without air gaps). Dielectric layer 18 can be made from materials such as silicon oxide, or low dielectric constant (i.e., low-k) materials, such as, doped $SiO_2$, silsesquioxanes, polyimides, fluorinated-polyimides, parylene, fluoro-polymers, poly(arylethers), fluorinated-poly(arylethers), porous-polymer/polyimide, polytetrafluoroethylene, and porous silica (also known as Aerogel and Xerogel).

By forming air gaps 22 in dielectric layer 18, the present invention reduces the effective dielectric constant of dielectric layer 18. Air is desirable because it has the lowest dielectric constant (i.e., k=1). Preferably, the air gaps 22 are of sufficient volume so that the effective dielectric constant of dielectric layer 18 is low. A sealing layer 26 is deposited over dielectric layer 18 to seal the air gaps 22. Via holes, such as via hole 28, are etched through sealing layer 26 and dielectric layer 18. A conductive plug 30 is formed in via hole 28. A second conductive layer 32 is deposited and patterned over sealing layer 26.

Figure 2:
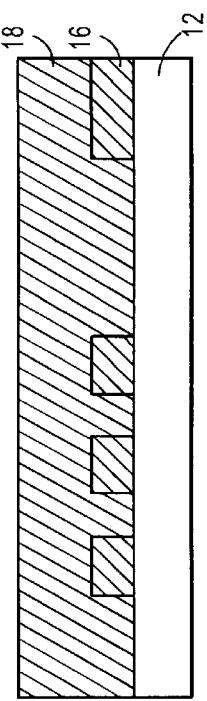
FIGS. 2–13 are cross sectional views of the interconnect structure of FIG. 1A at selected stages of fabrication.

FIGS. 2–13 are vertical cross sectional views illustrating stages of fabrication of the structure 10 of FIG. 1A. Referring to FIG. 2, a first conductive layer 16 is deposited and patterned to form a first interconnect layer having interconnect lines 16a–16d. After patterning, the interconnect lines are separated from each other by interconnect line separating spaces 17. The conductive layers described herein, such as first conductive layer 16, can be made from an electrically conducting material, such as polysilicon, titanium, titanium nitride, tantalum, tantalum nitride, tungsten, copper, aluminum or aluminum alloy. In addition, conductive layers described herein, such as first conductive layer 16, can include a combination of one or more of these conductive materials stacked atop each other to form a "stack" structure. For simplicity, FIG. 2 shows four interconnect lines 16a–d. However, it will be apparent to those skilled in the art that many other interconnect lines, as well as other geometries, may also form part of interconnect lines 16. Interconnect lines 16 have a vertical thickness on the order of 0.2 to 1.0 microns and a width which varies by design, but will typically be in the range of 0.1 to 1 micron. Wide lines having a width up to 100 microns are also possible. After the formation of interconnect lines 16, a thin insulative layer, such as silicon dioxide (not shown), having a thickness of 100 Angstroms to 1000 Angstroms may be optionally deposited over the surface of the structure.

Figure 3A:
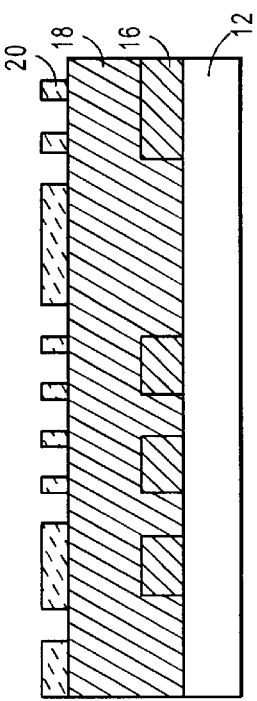

Referring to FIG. 3A, a dielectric, such as $SiO_2$, is deposited over layer 12 to fill the gaps between the interconnect lines of first interconnect layer 16 and to form dielectric layer 18. Dielectric layer 18 also electrically isolates first interconnect layer 16 from a subsequently formed interconnect layer. It is noted that dielectric layer 18 can include insulating materials, such as $SiO_2$, spin on glass (SOG), silicon nitride, the low-k materials described above, or a combination thereof.

Figure 3B:
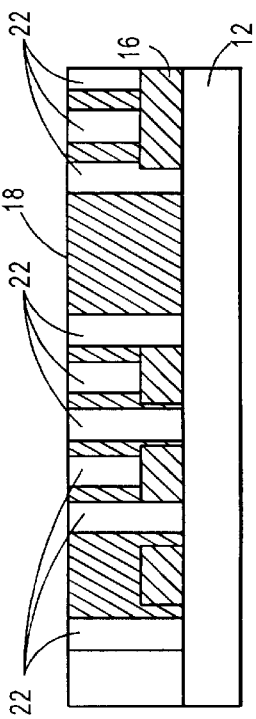

However, in certain applications it is preferable that dielectric layer 18 is a gap fill $SiO_2$ deposited by a high-density plasma (HDP) chemical vapor deposition (CVD) technique. After the gap fill oxide is deposited, a bulk $SiO_2$ layer 60 is deposited thereon by a plasma-enhanced CVD (PECVD) as shown in FIG. 3B. Alternatively, dielectric layer 18 and dielectric layer 60 can be entirely different materials. For example, dielectric layer 60 can be an oxide while dielectric layer 18 can be a low-k material. For the sake of simplicity, the combined dielectric layers 18 and 60 will be referred to herein as dielectric layer 18.

Figure 3C:
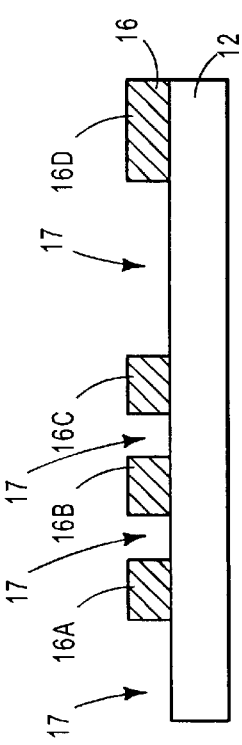

As shown in FIG. 3C, dielectric layer 18 can optionally be planarized according to techniques well known in the art. For example, a chemical mechanical polishing (CMP) or a sacrificial etch-back process may be used. First insulative layer 18 has a final thickness ranging from 0.3 to 1.0 microns above the top surface of first interconnect layer 16.

Figure 1B:
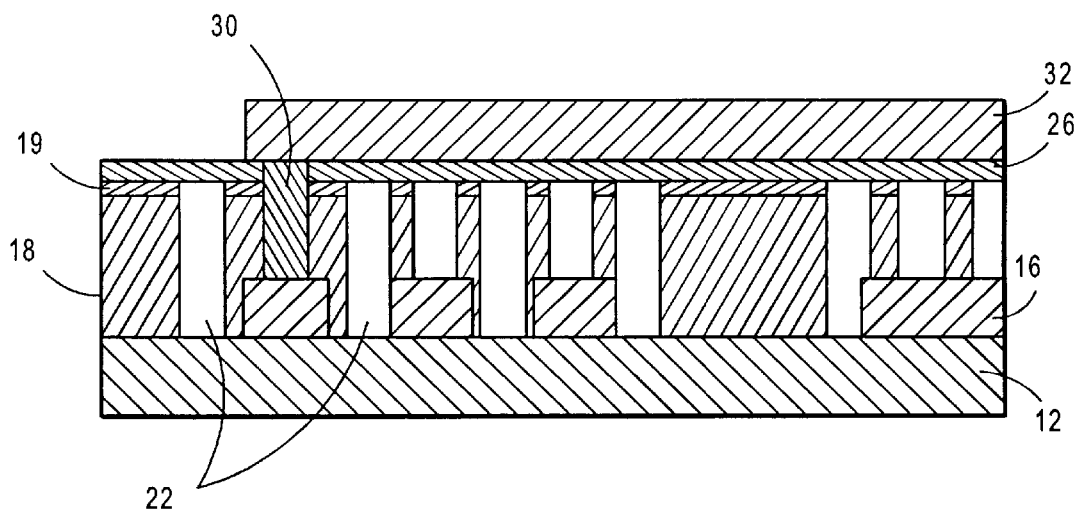

If dielectric layer 18 is made with a low-k material, a hard mask layer 19 (e.g., $SiO_2$ or SiN), having a preferable thickness in the range of 100 to 1000 Angstroms, can be deposited prior to photolithography steps described hereinafter. As is known by those of ordinary skill in the art, hard mask 19 is utilized during the etch and clean steps in transferring the air gap pattern to dielectric layer 18. FIG. 1B illustrates the interconnect structure of the first embodiment having a hard mask 19.

Figure 4:
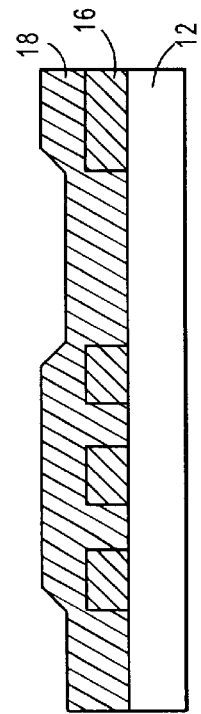

Referring now to FIG. 4, a photoresist layer 20 is deposited on dielectric layer 18 and patterned by using conventional photolithography techniques. For example, photoresist layer 20 is masked, exposed, and developed to define the location where air gaps 22 are to be formed. Optical enhancement techniques, such as phase shift mask (PSM), can be utilized for better resolution of the printed pattern.

Figure 5:
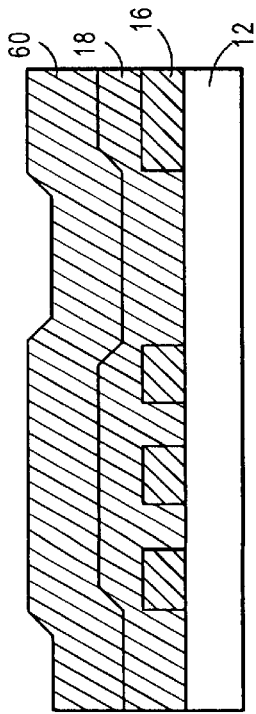

Referring to FIG. 5, the pattern of photo-resist layer 20 is transferred to first insulative layer 18 to form air gaps 22. For the purposes of this invention, the term, "air gaps" (also referred to herein as spaces or trenches) 22 is to be construed broadly, and is not limited to an opening having parallel straight edges; rather, "gap" can refer to any interstitial spacing within first insulative layer 18. The placement of air gaps 22, as well as the dimensions and shapes of these air gaps 22, are determined based on the interconnect requirements for the integrated circuit being fabricated.

Figure 35:
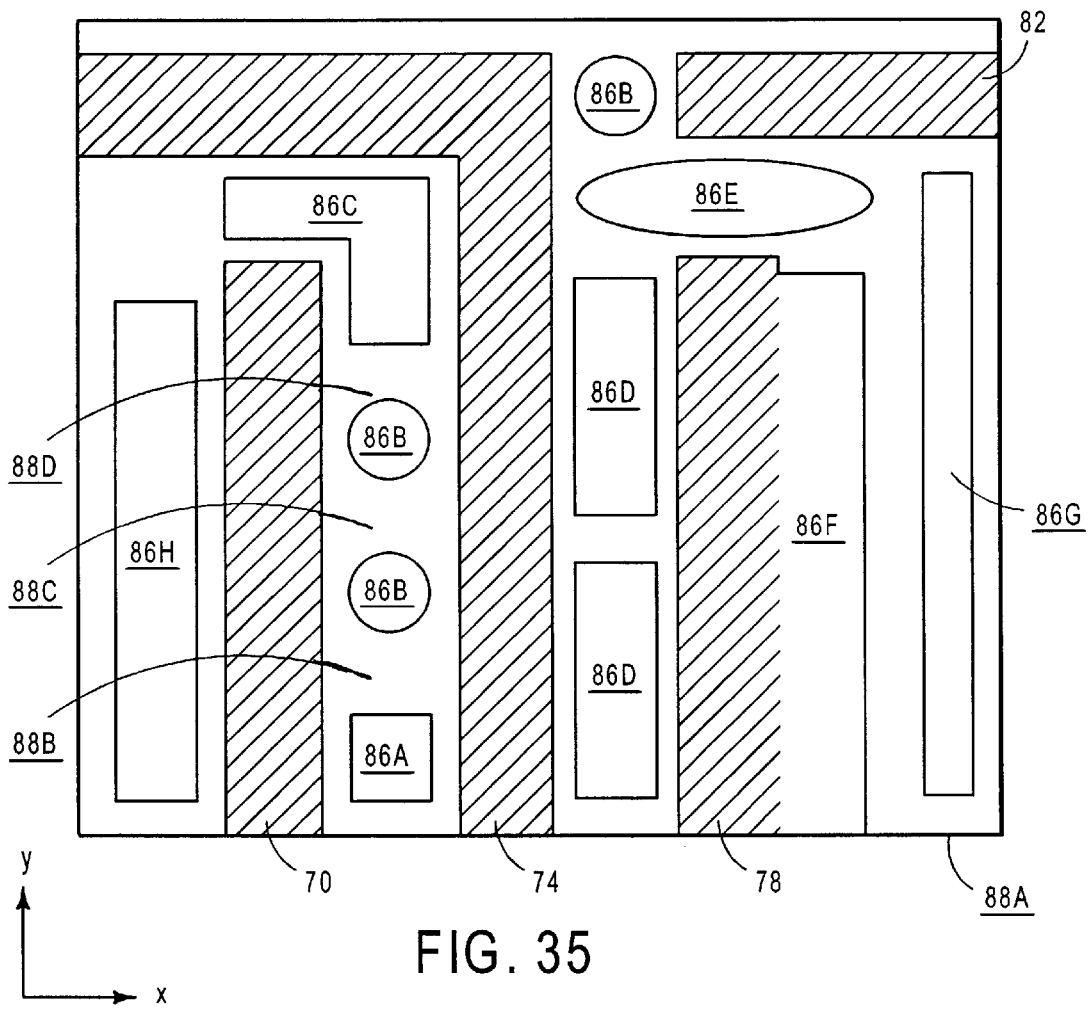
FIG. 35 is a top view of air gaps of the present invention having different shapes, sizes, and placement.

FIG. 35 is a top view of various shapes and placements of the air gaps of the present invention. A first interconnect line 70, a second interconnect line 74, a third interconnect line 78, and a fourth interconnect line 82 are illustrated with air gaps 86 disposed between. For example, a square air gap 86A, two circle air gaps 86B, and an L-shaped air gap 86C are provided between first interconnect line 70 and second interconnect line 74 to reduce the capacitance therebetween. Moreover, two rectangular air gaps 86D are provided between second interconnect line 74 and third interconnect line 78 to reduce the capacitance therebetween. Furthermore, an oval air gap 86E is provided between third interconnect line 78 and fourth interconnect line 82 to reduce the capacitance therebetween. A rectangular air gap 86F and another rectangular air gap 86G are formed to the right of third interconnect line 78 to reduce the capacitance between the third interconnect line 78 and interconnect lines (not shown) to the right of third interconnect line 78. Similarly, a rectangular air gap 86H is formed to the left of first interconnect line 70 to reduce the capacitance between the first interconnect line 70 and interconnect lines (not shown) to the left of first interconnect line 70.

As is evident in FIG. 35, the shape, size and placement of the air gaps of the present invention can vary from application to application for different circuits. For example, the top view of the air gaps can be any shape, such as in the shape of a circle, oval, square, rectangle, etc. The air gap can follow an interconnect line, such as the corner-shaped air gap 86C that follows a turn of an interconnect line. Air gaps can exist directly next to a interconnect line or can be separated from a interconnect line by a dielectric.

As shown in FIGS. 1A, 1B, 13, 16, 18, and 34, air gaps can also be formed on interconnect lines and extend from the top of the interconnect lines to the sealing layer. It will be evident to those of ordinary skill in the art that one can tailor the shape, size, and location of the air gaps of the present invention in order to minimize capacitance for a particular circuit application.

Referring back to FIG. 5, air gaps 22 are preferably formed between conductive lines 16a–16d, but not near via holes to avoid process issues and reliability issues related to plug formation.

When layer 12 is a semiconductor substrate, the etch depth of air gaps 22 can extend to layer 12. When layer 12 is a dielectric, the etch depth of air gaps 22 can extend to layer 12 or beyond. A chemical etchant is selected having good etch selectivity between dielectric layer 18 and interconnect lines 16 when etching air gaps 22. When dielectric layer 18 is $SiO_2$, a high density plasma etch, such as that described in "Selective Dry Etching in a High Density Plasma for 0.5 um Complementary Metal Oxide Semiconductor Technology" by J. Givens, S. Geissler, J. Lee, O. Cain, J. Marks, P. Keswick, and C. Cunningham, J. Vac. Sci. Technol. B 12(1), January/February 1994, can be utilized.

Figure 6:
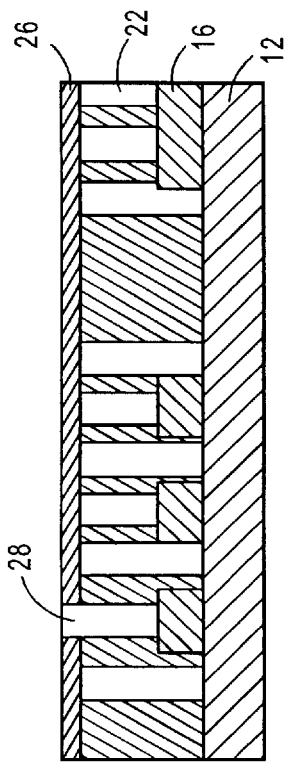

Referring to FIG. 6, a sealing layer 26 is deposited over first insulative layer 18 and air gaps 22. Sealing layer 26 acts to seal air gaps 22. As used herein, the term "seal", can mean either sealing air gaps 22 without filling air gaps 22 with any of the sealing material, or sealing air gaps 22 while partially filling air gaps 22 with some of the sealing material. Sealing layer 26 is relatively thin and has a thickness that is preferably in the range of 1000 Angstroms to 5000 Angstroms. The size, shape, and location of air gaps 22 can be designed in such a way as to allow sealing layer 26 to seal the air gaps and to minimize the extent to which sealing layer 26 partially fills air gaps 22. In one exemplary embodiment, air gaps 22 are circular holes having a diameter in the range of 0.25 um to 1.0 um. Also, the deposition process for sealing layer 26 is controlled to ensure that sealing layer 26 seals air gaps 22. A spin-on deposition technique, a CVD technique, or a combination thereof, can be utilized to deposit sealing layer 26.

Sealing layer 26 can be formed with any insulative material that has the following properties: (1) is compatible with post-via-etch clean processes; (2) is compatible with via plug CMP or etch-back processes, and (3) is compatible with the subsequent interconect line etch and clean steps. For example, sealing layer 26 can be made of the same material as or of a different material from dielectric layer 18. When sealing layer 26 is made of the same material as dielectric layer 18, the etch chemistry does not need to be changed when etching a via hole in sealing layer 26 and dielectric layer 18 as described hereinafter with reference to FIG. 8. It is noted that sealing layer 26 can include insulating materials, such as $SiO_2$, doped $SiO_2$, spin on glass (SOG), silicon nitride, the low-k materials described above, or a combination thereof.

Figure 8:
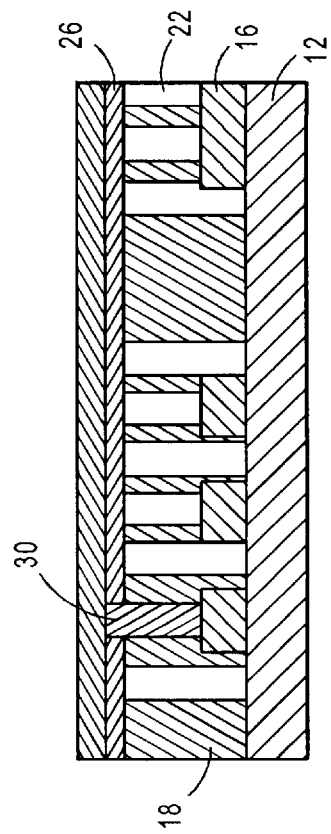
Figure 7:
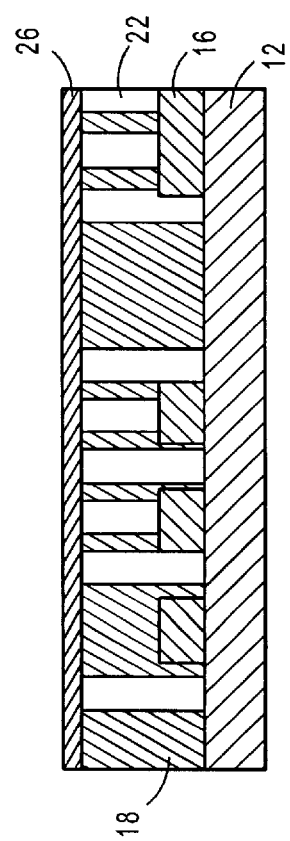

Referring to FIG. 7, a photoresist layer 27 is deposited and patterned. A photo-mask is employed to pattern photoresist layer 27 with a via hole pattern. Referring to FIG. 8, the via hole pattern is transferred to the sealing layer 26 and the first insulative layer 18. For example, via hole 28 is etched in sealing layer 26 and first insulative layer 18) according to conventional techniques, such as plasma etch. In an exemplary embodiment, when dielectric 18 is made from $SiO_2$, and sealing layer 26 is spin-on-glass (SOG), then a conventional carbon-fluoride based plasma can be used to etch sealing layer 26 and dielectric 18. It will be appreciated that although only one via hole 28 is shown, there are typically many via holes in a via pattern.

One advantage of this invention is that conventional processing techniques can be used while achieving a lower effective dielectric constant for dielectric layer 18. Air gaps 22 can be selectively formed separate from via holes or in areas without via holes. In one embodiment, air gaps 22 are selectively formed in regions where interconnect lines 16 are closely spaced. Where interconnect lines are further spaced, such as line 16c and line 16d, fewer air gaps 22 are formed. When air gaps are placed directly next to interconnect lines (e.g., 16c and 16d), the fringe capacitance is reduced leading to a reduction in the inter-layer capacitance. It is not required to form high volume air gaps between interconnect lines 16c and 16d since the distance between these interconnect lines is sufficiently large to keep the capacitance therebetween low. In these areas and in other areas discussed hereinbelow, the first insulative layer 18 can be left to serve as support pillars 18a for increased thermal conductivity and increased mechanical strength of the interconnect structure.

The air gaps and resulting interconnect structure of the present invention are different in several important respects from the interconnect resulting from the intentional poor-fill approach discussed in the Background. First, the void left by a poor-fill approach necessarily follows the contour of the gap between interconnect lines. Second, with the poor-fill approach there is no ability to provide more than one continuous void between interconnect lines, or to leave support pillars between the voids.

In sharp contrast, the interconnect of the present invention can provide (1) multiple air gaps between interconnect lines in various directions, such as both in a first direction or dimension and in a second direction or dimension. The first direction can be arbitrarily chosen to generally follow the path of an interconnect line (i.e., generally parallel to the first interconnect line or a portion thereof). The second direction can be arbitrarily chosen to be generally transverse to the first direction (i.e., generally perpendicular to the first interconnect line or a portion thereof). For example, the first direction can be along the x-dimension (i.e., along the width of the gap between interconnect lines), and the second direction can be along the y-dimension (i.e., along the length of the gap between interconnect lines). In further contrast, the interconnect of the present invention can (2) provide support pillars between the air gaps, and (3) provide an air gap pattern that does not follow the contour of the gap between the interconnect lines. For example, referring to FIG. 35, in the x-dimension a first air gap (e.g., 86F) and a second air gap (e.g., 86G) can be provided between a first interconnect 78 and a second interconnect (not shown) and a support pillar 88A can be provided. In another example, referring to FIG. 35, in the y-dimension a first air gap (e.g., 86A), a second air gap (e.g., first circle 86B), a third air gap (e.g., second circle 86B), and a fourth air gap (e.g., 86C) can be provided between a first interconnect line 70 and a second interconnect line 74 and support pillars 88B, 88C, and 88D can be provided between the air gaps in the y-dimension. As used herein, "support pillar" can mean a support structure having any shape that is formed by dielectric 18 to increase the mechanical strength and thermal conductivity of the interconnect line.

Figure 9:
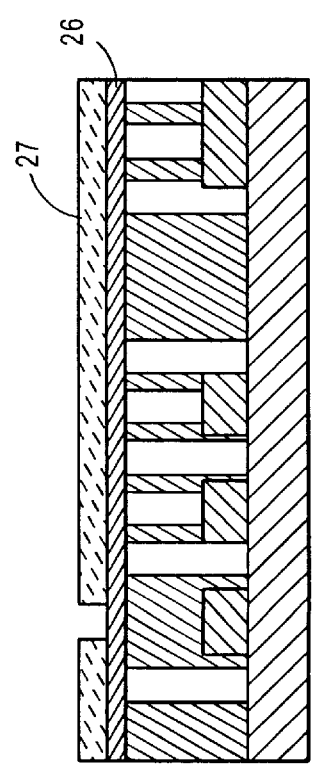
Figure 12:
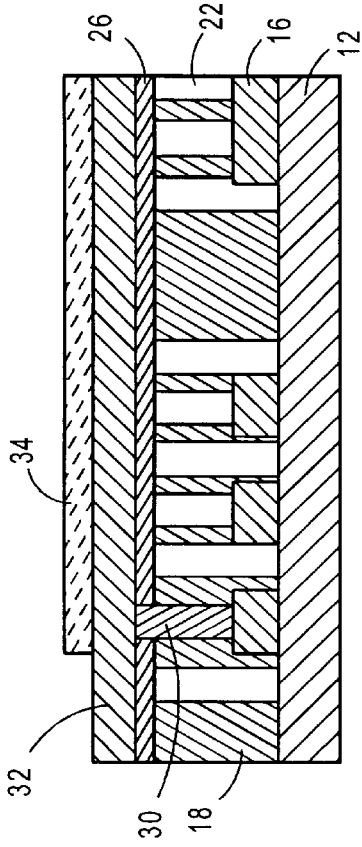
Figure 10:
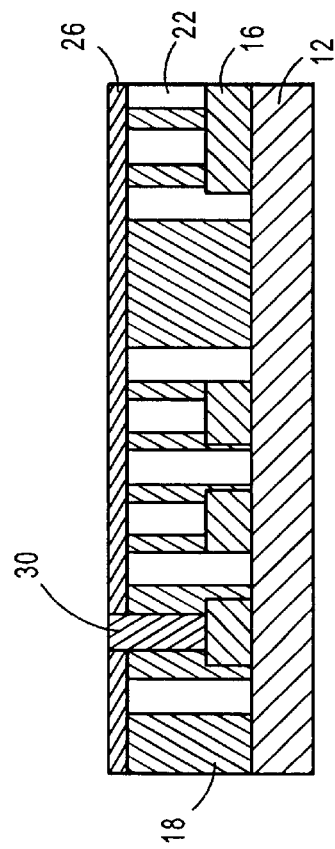

Referring to FIG. 9, conductive plugs 30 are formed in the via holes. Conductive plugs 30 can include a conductive material, such as polysilicon, titanium, titanium nitride, tantalum, tantalum nitride, tungsten, copper, aluminum or aluminum alloy, or a combination thereof. For example, tungsten can be deposited to fill via hole 28 according to conventional CVD tungsten deposition processes. Prior to tungsten deposition, a layer of TiN can be first deposited either by a physical vapor deposition (PVD) or a CVD technique. The TiN layer acts as a precursor for CVD tungsten deposition. Referring to FIG. 10, excess conductive materials are removed according to conventional process techniques, such as CMP or etch-back, to leave conductive plug 30.

Figure 13:
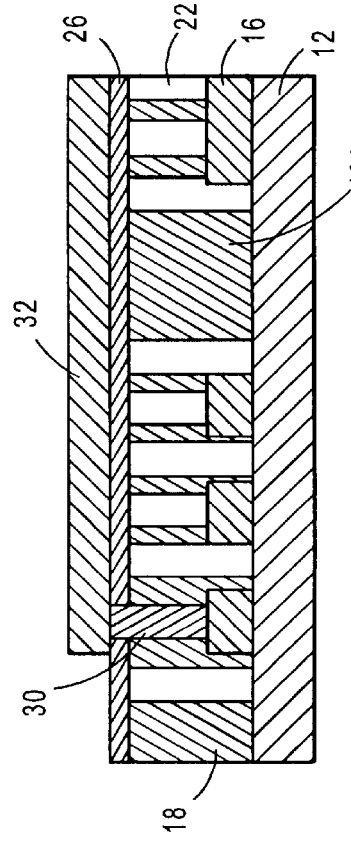
Figure 11:
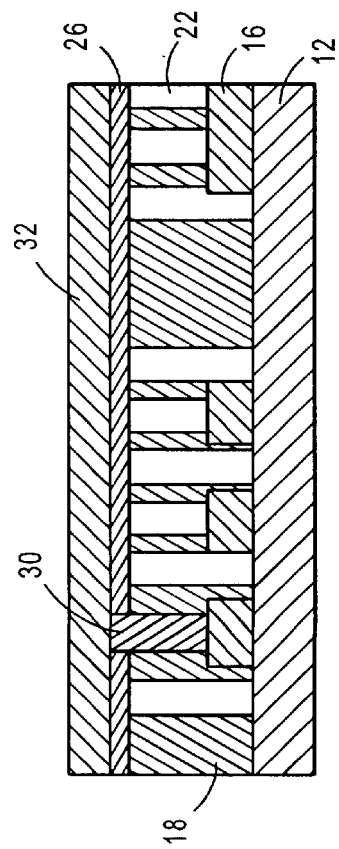
Figure 21:
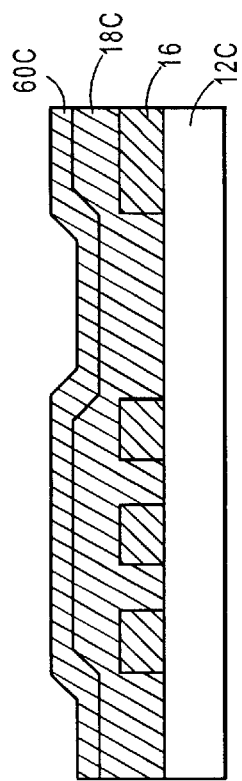
Figure 22:
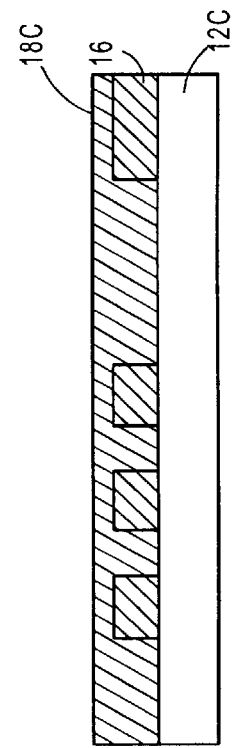
Figure 19:
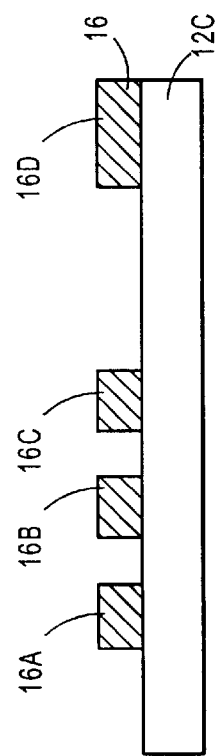
Figure 20:
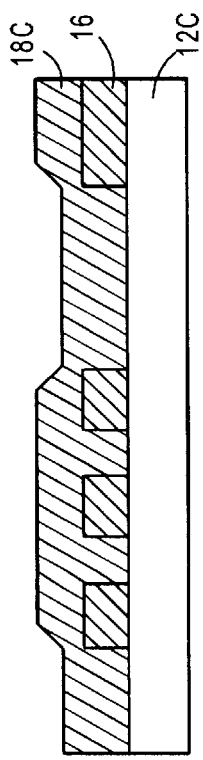
Figure 23:
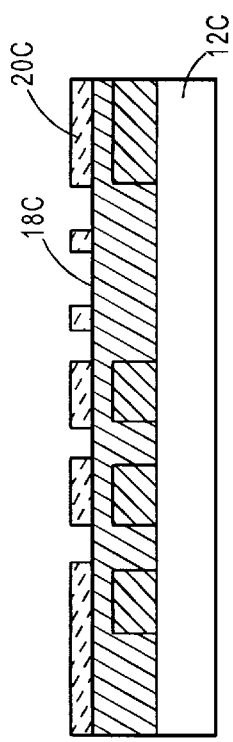
Figure 24:
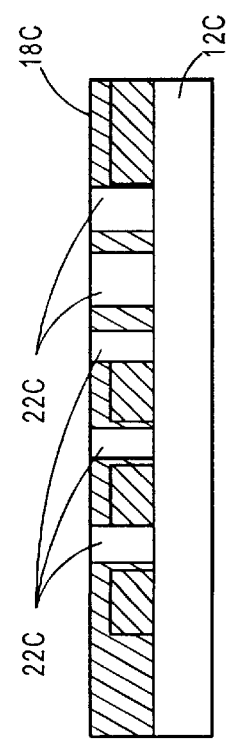
Figure 25:
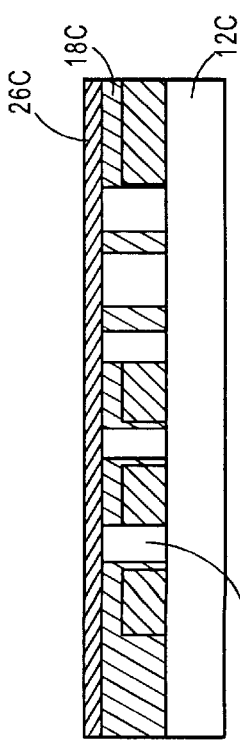

Referring to FIG. 11, a second conductive layer 32 is deposited over sealing layer 26. Second conductive layer 32 can include a conductive material, such as polysilicon, titanium, titanium nitride, tantalum, tantalum nitride, tungsten, copper, aluminum or aluminum alloy, or a combination thereof. Then, referring to FIG. 12, a photoresist layer 34 is deposited and patterned. Referring to FIG. 13, the photoresist pattern is transferred to second conductive layer 32 to define a second level of interconnect lines using conventional plasma etch processing techniques known in the art. In a preferred embodiment, second conductive layer 32 can be formed with metals, such as aluminum or an aluminum alloy, sandwiched between titanium or TiN layers.

FIGS. 14–16 are cross sectional views illustrating an alternative approach to form plugs and a second interconnect layer utilizing a single metal deposition step. After the structure has been processed to the point illustrated in FIG. 8, the following process steps can be performed in place of the steps of FIGS. 9–13. Referring to FIG. 14, a second conductive material can be deposited to simultaneously fill via hole 28 and to form second conductive layer 32. The second conductive material can be any of the materials described previously for first conductive layer 16 and conductive plug 30. When second conductive material is aluminum or an aluminum alloy, a PVD, CVD, or a combination thereof can be utilized for the deposition. When second conductive material is copper, a PVD, CVD, plating process, or a combination thereof can be utilized for the deposition. Prior to the Al or Cu deposition, it is understood that a barrier layer, adhesion layer, wetting layer, and seed layer can be first deposited as needed. A barrier layer serves to prevent Cu diffusion into dielectric 18. An adhesion layer promotes adhesion between the deposited material (e.g., Cu or Al) and dielectric 18. A wetting layer promotes the filling of high aspect ratio features by the deposited material. A seed layer is a precursor layer for uniform Cu plating.

Referring to FIG. 15, a photoresist layer 34 is deposited and patterned in preparation for patterning second conductive layer 32. An anti-reflection-coating (ARC) layer, such as TiN, SiN, or SiON, can be deposited before photoresist layer 34 is deposited. FIG. 16 illustrates the structure after second conductive layer 32 is patterned. The advantage of this alternative approach to simultaneously forming conductive plugs and forming the second conductive layer is process simplification.

FIG. 17 is a sectional view of an interconnect structure 10A according to a second embodiment of the present invention that reduces primarily intra-layer capacitance. The description of structure and process steps similar to those of the first embodiment is not repeated herein, and similar features are denoted by the same numeral designation with the addition of an "A" label. In FIG. 17, it is noted that the air gaps 22A are formed only between interconnect lines. For example, whereas air gaps 22A are shown between interconnect lines 16a and 16b, between interconnect lines 16b and 16c, and between interconnect lines 16c and 16d, no air gaps are shown between the first interconnect layer 16 and the second interconnect layer 32A.

FIG. 18 is a cross sectional view of an interconnect structure 10B according to a third embodiment of the present invention that reduces only inter-layer capacitance. The description of structure and process steps similar to those of the first embodiment is not repeated herein, and similar features are denoted by the same numeral designation with the addition of a "B" label. In FIG. 18, it is noted that the air gaps 22B are formed only between the interconnect layers 16 and 32B and not between interconnect lines 16a–16d. For example, an air gap 22B is shown between interconnect line 16b and second interconnect layer 32B and another air gap 22B is shown between interconnect line 16c and second interconnect layer 32B. Similarly, two air gaps 22B are shown between interconnect line 16d and second interconnect layer 32B.

The second and third embodiments can be made according to the processing steps illustrated in FIGS. 2–16. The location of air gaps 22A, 22B is determined in the processing related to FIG. 4, and specifically is determined by the air gap pattern transferred to photoresist 20. By changing the air gap pattern of photoresist 20, air gaps can be selectively placed only between interconnect lines in the same layer, only between the interconnect layers, or both between interconnect lines in the same layer and between interconnect layers.

Although the present invention introduces air gaps to reduce intra-layer and inter-layer capacitance, air gaps are created generally at the expense of and at the sacrifice of mechanical strength and thermal conductivity. Accordingly, a trade off between the benefits of air gaps should be weighed with the penalties of introducing the air gaps. In this regard, the present invention allows a designer to selectively place air gaps at locations in the layout that are critical. For example, if a critical path is located on an interconnect layer and there are other interconnect lines that are positioned around this critical path, air gaps can be placed between these interconnect lines and the critical path. Similarly, if a critical path is on a first interconnect layer and there are one or more interconnect lines in a second interconnect layer that adversely affect the critical path, air gaps can be placed only between the top surface of the critical path and the second interconnect layer.

In this manner, a designer can selectively address either only intra-layer capacitance, only inter-layer capacitance, or both intra-layer capacitance and inter-layer capacitance, tailoring the placement of the air gaps to the integrated circuit design and the layout.

FIGS. 19–33 are cross-sectional views of an interconnect structure according to a fourth embodiment of the present invention at selected stages of fabrication. This embodiment utilizes another dielectric layer (i.e., a second dielectric layer 62C) in addition to the first dielectric layer 18C. This embodiment provides an interconnect that can have two different dielectric materials. For example, one dielectric layer can be made from $SiO_2$, and the second dielectric layer can be made from a low-k material.

This embodiment is based on the second embodiment of FIG. 17 since only intra-line capacitance is addressed. However, the steps in FIGS. 19–25 correspond generally to those in FIGS. 2, 3A–3C, 4–6, respectively, and description related thereto will not be repeated herein. The main difference in this embodiment is that a second dielectric layer 62C is deposited over sealing layer 26C in FIG. 26, and the processing thereafter (such as via hole formation) affects second dielectric layer 62C. Moreover, the steps in FIGS. 27 and 28 correspond generally to those in FIGS. 7 and 8, respectively, except that photoresist is applied to second dielectric layer 62C instead of sealing layer 26, and the via hole is etched in second dielectric layer 62C in addition to sealing layer 26C and first dielectric layer 18C.

FIG. 31B illustrates the interconnect structure of the fourth embodiment having hard masks 19C and 19D. If first dielectric layer 18C and second dielectric layer 62C (described below) are made with a low-k material, a first hard mask layer 19C and a second hard mask layer 19D (e.g., $SiO_2$ or SiN), having a preferable thickness in the range of 100 to 1000 Angstroms, can be deposited after first dielectric layer 18C is deposited (i.e., after FIG. 22) and after second dielectric layer 62C is deposited (i.e., after FIG. 26), respectively. As is known by those of ordinary skill in the art, first hard mask 19C is utilized during the etch and clean steps in transferring the air gap pattern to dielectric layer 18C, and second hard mask 19D is utilized during the etch and clean steps in transferring the via hole pattern to dielectric layer 62C, sealing layer 26C, first hard mask 19C and dielectric layer 18C. It is noted that the interconnect structure of the fourth embodiment of the present invention can include only first hard mask 19C (for example, the case where only the first dielectric is made of a low-k material), only second hard mask 19D (for example, the case where only the second dielectric is made of a low-k material), or both first hard mask 19C and second hard mask 19D (for example, the case where both the first dielectric and the second dielectric are made from a low-k material).

Referring back to FIG. 24, when dielectric layer 18C is made of $SiO_2$, a plasma etch chemistry comprising carbon fluoride is preferably utilized to etch air gaps 22C through dielectric layer 18C. When dielectric layer 18C is made of an organic low-k material, and a hard mask 19C is used, preferably a plasma etch with a plasma chemistry comprising carbon fluoride is utilized to first etch the $SiO_2$ or SiN hard mask and a plasma etch with a plasma chemistry comprising $O_2$ is utilized to etch air gaps 22C through dielectric layer 18C.

Figure 26:
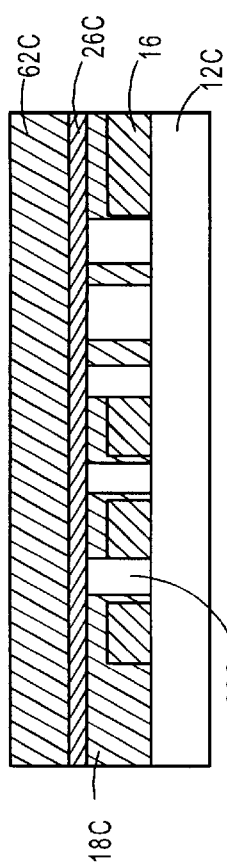
Figure 27:
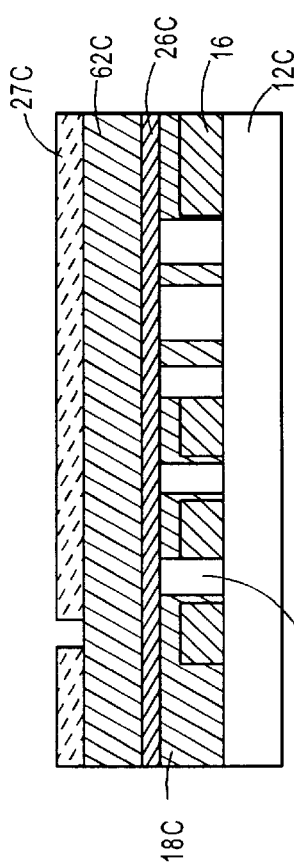
Figure 28:
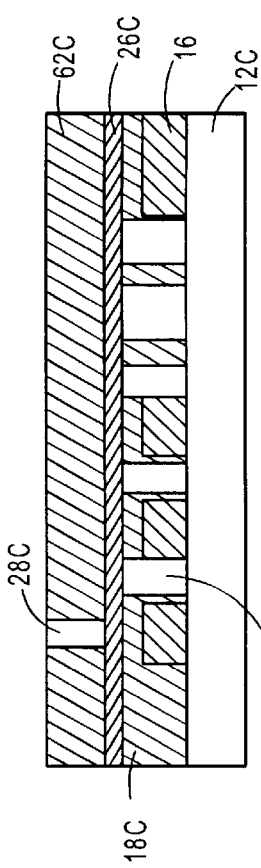

Referring to FIG. 26, a second dielectric layer 62C, such as $SiO_2$, is deposited on sealing layer 26C. Second dielectric layer can include one or more of the insulative materials described previously for the first dielectric layer 18 of the first embodiment. Referring to FIG. 27, a photoresist layer 27C is masked, exposed, and developed to define a via hole pattern that specifies the location where via holes are to be formed. Referring to FIG. 28, a via hole pattern having via holes, such as via hole 28C, is transferred to second dielectric layer 62C, sealing layer 26C, and first dielectric layer 18C. An etchant is chosen which can selectively etch second dielectric 62C, sealing layer 26C, and first dielectric layer 18C without etching interconnect lines 16C. A single etch chemistry can be utilized if first dielectric layer 18C, second dielectric layer 62C, and sealing layer 26C are made of the same or similar material. If one or more of these layers 18C, 26C, 62C, are made of different materials, more than one etch chemistry may be needed. For example, a first etch chemistry can be utilized to etch through second dielectric layer 62C. Once the sealing layer 26C is reached, a new etch chemistry (a second etch chemistry) is introduced to etch through sealing layer 26C. Once the first dielectric layer 18C is reached, a new etch chemistry (a third etch chemistry) is introduced to etch through first dielectric layer 18C. If the first dielectric layer 18C is made of the same or similar material as the second dielectric layer 62C, then the first and third etch chemistry can be the same. Once via holes, such as via hole 28C, have been etched to the desired depth, photoresist layer 27C is removed with well-known techniques.

The steps in FIGS. 29–31A correspond generally to those in FIGS. 9, 10, and 13 of the first embodiment, and illustrate how the conductive plug 30C is formed and how the second conductive layer 32C is deposited and patterned.

FIGS. 32–33 are cross sectional views, illustrating an alternative approach (for the fourth embodiment) to form plugs and a second interconnect layer utilizing a single metal deposition step. After the structure has been processed to the point illustrated in FIG. 28, the following process steps can be performed instead of the steps illustrated in FIGS. 29–31A. The steps in FIGS. 32 and 33 correspond generally to those in FIGS. 14 and 16, respectively, and the description of simultaneously forming conductive plug 30C and depositing second conductive layer 32C, as well as the patterning of second conductive layer 32C, is not repeated herein.

Figure 34:
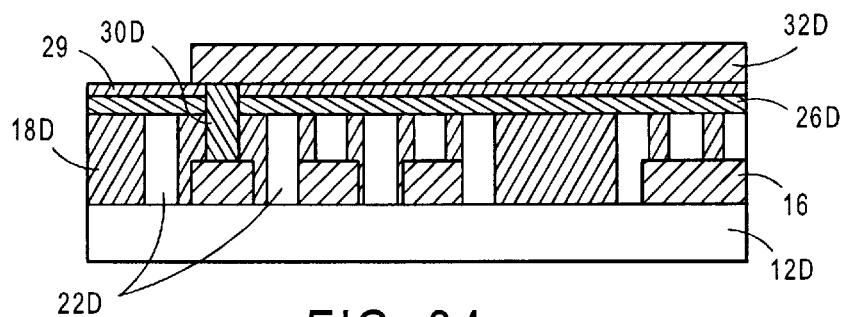
FIG. 34 is a cross sectional view of an interconnect structure according to a fifth embodiment of the present invention that utilizes an additional layer.

FIG. 34 is a cross sectional view of an interconnect structure according to a fifth embodiment of the present invention that utilizes a processing protection layer 29. This embodiment is based on the first embodiment. Processing protection layer 29 is deposited over sealing layer 26D following the processing flow shown in FIG. 6. The description of the etch of air gaps 22D prior to the deposition of processing protection layer 29, and the via hole etch followed by formation of conductive plugs and a second interconnect layer, is the same as in the first embodiment and will not be repeated herein. Processing protection layer 29 is similar to second dielectric layer 62C of the fourth embodiment, except that processing protection layer 29 has a reduced thickness (compare FIG. 34 with FIGS. 31A and 33), which makes layer 29 more suitable as a processing protection layer, as explained hereinafter, rather than as a second dielectric layer. Layer 29 can serve as a protective layer to protect sealing layer 26D from chemicals utilized in resist strip, wet clean, polish and etch for the formation of conductive plug 30 and the second interconnect layer 32D, and any other processing steps.

The fourth and fifth embodiments have the advantage over the other embodiments in that certain requirements for the selection of a material for sealing layer 26, discussed previously, can be waived. Specifically, the requirements that the material for the sealing layer 26 be compatible with via plug metal CMP or etch-back process, and be compatible with the subsequent interconnect etch and clean steps, can be relaxed. The additional dielectric layer 62C or 29 protects the sealing layer 26 in these subsequent process steps.

It will be understood by those of ordinary skill in the art that the structures and processes of the present invention may be repeated to form additional levels of interconnect. For example, five or six such interconnect layers may be formed. However, the invention is equally applicable to devices having only one or two interconnect layers, as well as those having more than six levels of interconnect.

It is important to note that the present invention can be employed to reduce only intra-layer capacitance by introducing air gaps only between the interconnect lines and not between interconnect layers. This embodiment can be advantageously used for the last interconnect layer and also for structures having a single interconnect layer. In addition, the present invention can also be employed to reduce only inter-layer capacitance by introducing air gaps only between interconnect layers and not between interconnect lines within one layer. This embodiment can be advantageously used in applications where inter-layer capacitance is critical.

Since every circuit design can have different signal paths that are critical to the performance of the circuit, the present invention provides a process and interconnect structure that can be flexibly tailored to reduce capacitance in the interconnect, especially capacitance between the critical signal paths and other interconnect lines.

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. An interconnect structure comprising:
   a) a first layer of patterned conductive material having a first interconnect line, a second interconnect line and a trench therebetween;
   b) a first insulating material held within the trench and disposed over the first layer of patterned conductive material;
   c) at least two air gaps within the first insulating material and between the first interconnect line and the second interconnect line, said air gaps separated by a support pillar; and
   d) a sealing layer over the first insulating material for sealing the air gaps.

2. The interconnect structure of claim 1 wherein the sealing layer comprises a low dielectric constant (low-k) material.

3. The interconnect structure of claim 1 wherein the first insulating material comprises a low dielectric constant (low-k) material.

4. The interconnect structure of claim 1 further comprising:
   a) a second layer of patterned conductive material over the sealing layer; and
   b) a via opening within the sealing layer and first insulating material for holding a conductive plug that provides a connection between the first layer of conductive material and the second layer of conductive material.

5. The interconnect structure of claim 4 wherein the conductive material for the first conductive layer, the second conductive layer, and the conductive plug is selected from the group consisting of polysilicon, titanium, titanium nitride, tantalum, tantalum nitride, tungsten, copper, aluminum, and aluminum alloy.

6. The interconnect structure of claim 1 further comprising
   a) a second insulating material over the sealing layer;
   b) a second layer of patterned conductive material over the second insulating material; and
   c) a via opening within the second insulating material, the sealing layer and first insulating material for holding a conductive plug that provides a connection between the first layer of conductive material and the second layer of conductive material.

7. The interconnect structure of claim 6 wherein the second insulating material comprises a low dielectric constant (low-k) material.

8. The interconnect structure of claim 6 wherein the conductive material for the first conductive layer, the second conductive layer, and the conductive plug is selected from the group consisting of polysilicon, titanium, titanium nitride, tantalum, tantalum nitride, tungsten, copper, aluminum, and aluminum alloy.

9. The interconnect structure of claim 1 further comprising
   a) a second insulating material over the sealing layer;
   b) a hard mask over the second insulating material;
   c) a second layer of patterned conductive material over the hard mask; and
   d) a via opening within the hard mask, the second insulating material, the sealing layer and first insulating material for holding a conductive plug that provides a connection between the first layer of conductive material and the second layer of conductive material.

10. The interconnect structure of claim 9 wherein the second insulating material comprises a low dielectric constant (low-k) material.

11. The interconnect structure of claim 9 wherein the conductive material for the first conductive layer, the second conductive layer, and the conductive plug is selected from the group consisting of polysilicon, titanium, titanium nitride, tantalum, tantalum nitride, tungsten, copper, aluminum, and aluminum alloy.

12. The interconnect structure of claim 9 wherein the hard mask is comprised of a material selected from the group consisting of silicon nitride, silicon carbide, and silicon oxide.

13. An interconnect structure comprising:
   a) a first layer of patterned conductive material having a first interconnect line, a second interconnect line and a trench therebetween;
   b) a first insulating material held within the trench and disposed over the first layer of patterned conductive material;
   c) a first hard mask over the first insulating material;
   d) at least two air gaps within the first insulating material and first hard mask and between the first interconnect line and the second interconnect line, said air gaps separated by a support pillar; and
   e) a sealing layer over the first insulating material for sealing the air gaps.

14. The interconnect structure of claim 13 wherein the sealing layer comprises a low dielectric constant (low-k) material.

15. The interconnect structure of claim 13 wherein the first insulating material comprises a low dielectric constant (low-k) material.

16. The interconnect structure of claim 13 further comprising:
   a) a second layer of patterned conductive material over the sealing layer; and
   b) a via opening within the sealing layer and first insulating material for holding a conductive plug that provides a connection between the first layer of conductive material and the second layer of conductive material.

17. The interconnect structure of claim 16 wherein the conductive material for the first conductive layer, the second conductive layer, and the conductive plug is selected from the group consisting of polysilicon, titanium, titanium nitride, tantalum, tantalum nitride, tungsten, copper, aluminum, and aluminum alloy.

18. The interconnect structure of claim 13 further comprising
   a) a second insulating material over the sealing layer;
   b) a second layer of patterned conductive material over the second insulating material; and
   c) a via opening within the second insulating material, the sealing layer and first insulating material for holding a conductive plug that provides a connection between the first layer of conductive material and the second layer of conductive material.

19. The interconnect structure of claim 18 wherein the second insulating material comprises a low dielectric constant (low-k) material.

20. The interconnect structure of claim 18 wherein the conductive material for the first conductive layer, the second conductive layer, and the conductive plug is selected from the group consisting of polysilicon, titanium, titanium nitride, tantalum, tantalum nitride, tungsten, copper, aluminum, and aluminum alloy.

21. The interconnect structure of claim 13 further comprising
   a) a second insulating material over the sealing layer;
   b) a second hard mask over the second insulating material;
   c) a second layer of patterned conductive material over the second hard mask; and
   d) a via opening within the second hard mask, the second insulating material, the sealing layer, the first hard mask, and first insulating material for holding a conductive plug that provides a connection between the first layer of conductive material and the second layer of conductive material.

22. The interconnect structure of claim 21 wherein the second insulating material comprises a low dielectric constant (low-k) material.

23. The interconnect structure of claim 21 wherein the conductive material for the first conductive layer, the second conductive layer, and the conductive plug is selected from the group consisting of polysilicon, titanium, titanium nitride, tantalum, tantalum nitride, tungsten, copper, aluminum, and aluminum alloy.

24. The interconnect structure of claim 13 wherein the first hard mask is comprised of a material selected from the group consisting of silicon nitride, silicon carbide, and silicon oxide.

25. The interconnect structure of claim 21 wherein the material for the first and second hard mask is selected from the group consisting of silicon nitride, silicon carbide, and silicon oxide.

26. The interconnect structure of claim 1 wherein the air gap has a top sectional having one of the following shapes: circle, oval, square, and rectangle.

27. The interconnect structure of claim 13 wherein the air gap has a top sectional having one of the following shapes: circle, oval, square, rectangle.

28. An interconnect structure comprising:
   a) a first layer of patterned conductive material having trenches, each trench having an X dimension and a Y dimension;
   b) a first insulating material held within the trench and disposed over the first layer of patterned conductive material;
   c) a first air gap and a second air gap within the first insulating material, said first air gap and said second air gap disposed along the X dimension of the trench and separated by a support pillar,
   d) a sealing layer over the first insulating material for sealing the first air gap and second air gap;
   e) a second layer of patterned conductive material over the sealing layer; and
   f) a via opening within the sealing layer and first insulating material for holding a conductive plug that provides a connection between the first layer of conductive material and the second layer of conductive material.

29. An interconnect structure comprising:
   a) a first layer of patterned conductive material having trenches, each trench having an X dimension and a Y dimension;
   b) a first insulating material held within the trench and disposed over the first layer of patterned conductive material;
   c) a first air gap and a second air gap within the first insulating material, said first air gap and said second air gap disposed along the Y dimension of the trench and separated by a support pillar;
   d) a sealing layer over the first insulating material for sealing the first air gap and second air gap;
   e) a second layer of patterned conductive material over the sealing layer; and
   f) a via opening within the sealing layer and first insulating material for holding a conductive plug that provides a connection between the first layer of conductive material and the second layer of conductive material.

30. An interconnect structure comprising:
   a) a first layer of patterned conductive material having an interconnect line and trenches;
   b) a first insulating material held within the trench and disposed over the first layer of patterned conductive material;
   c) an air gap within the first insulating material, said air gap directly against the interconnect line;
   d) a sealing layer over the first insulating material for sealing the first air gap and second air gap;
   e) a second layer of patterned conductive material over the sealing layer; and
   f) a via opening within the sealing layer and first insulating material for holding a conductive plug that provides a connection between the first layer of conductive material and the second layer of conductive material.

31. The interconnect structure of claim 30 further comprising
   a) a support pillar made from the first insulating material disposed adjacent to the air gap.

32. An interconnect structure comprising:
   a) a first layer of patterned conductive material having an interconnect line and trenches, said interconnect line having a top surface;
   b) a first insulating material held within the trench and disposed over the first layer of patterned conductive material;
   c) an air gap within the first insulating material, said air gap extending from the top surface of the interconnect line;
   d) a sealing layer over the first insulating material for sealing the first air gap and second air gap;
   e) a second layer of patterned conductive material over the sealing layer; and
   f) a via opening within the sealing layer and first insulating material for holding a conductive plug that provides a connection between the first layer of conductive material and the second layer of conductive material.

33. The interconnect structure of claim 6, wherein the first insulating material and the second insulating material are the same material.

34. The interconnect structure of claim 6, wherein the first insulating material and the second insulating material are different materials.

35. The interconnect structure of claim 18, wherein the first insulating material and the second insulating material are the same material.

36. The interconnect structure of claim 18, wherein the first insulating material and the second insulating material are different materials.

37. The interconnect structure of claim 2 wherein the low dielectric constant (low-k) material is selected from the group consisting of silicon oxide ($SiO_2$), doped $SiO_2$, spin on glass (SOG), silicon nitride silsesquioxanes, polyimides, fluorinated polyimides, parylene, fluoro-polymers, poly(arylethers), fluorinated-poly(arylethers), porous-polymer/polyimide, polytetrafluoroethylene, and porous silica.

38. The interconnect structure of claim 3 wherein the low dielectric constant (low-k) material is selected from the group consisting of silicon oxide ($SiO_2$), doped $SiO_2$, spin on glass (SOG), silicon nitride, silsesquioxanes, polyimides, fluorinated polyimides, parylene, fluoro-polymers, poly(arylethers), fluorinated-poly(arylethers), porous-polymer/polyimide, polytetrafluoroethylene, and porous silica.

39. The interconnect structure of claim 7 wherein the low dielectric constant (low-k) material is selected from the group consisting of silicon oxide ($SiO_2$), doped $SiO_2$, spin on glass (SOG), silicon nitride, silsesquioxanes, polyimides, fluorinated polyimides, parylene, fluoro-polymers, poly(arylethers), fluorinated-poly(arylethers), porous-polymer/polyimide, polytetrafluoroethylene, and porous silica.

40. The interconnect structure of claim 10 wherein the low dielectric constant (low-k) material is selected from the group consisting of silicon oxide ($SiO_2$), doped $SiO_2$, spin on glass (SOG), silicon nitride, silsesquioxanes, polyimides, fluorinated polyimides, parylene, fluoro-polymers, poly (arylethers), fluorinated-poly(arylethers), porous-polymer/polyimide, polytetrafluoroethylene, and porous silica.

41. The interconnect structure of claim 14 wherein the low dielectric constant (low-k) material is selected from the group consisting of silicon oxide ($SiO_2$), doped $SiO_2$, spin on glass (SOG), silicon nitride, silsesquioxanes, polyimides, fluorinated polyimides, parylene, fluoro-polymers, poly (arylethers), fluorinated-poly(arylethers), porous-polymer/polyimide, polytetrafluoroethylene, and porous silica.

42. The interconnect structure of claim 15 wherein the low dielectric constant (low-k) material is selected from the group consisting of silicon oxide ($SiO_2$), doped $SiO_2$, spin on glass (SOG), silicon nitride, silsesquioxanes, polyimides, fluorinated polyimides, parylene, fluoro-polymers, poly (arylethers), fluorinated-poly(arylethers), porous-polymer/polyimide, polytetrafluoroethylene, and porous silica.

43. The interconnect structure of claim 19 wherein the low dielectric constant (low-k) material is selected from the group consisting of silicon oxide ($SiO_2$), doped $SiO_2$, spin on glass (SOG), silicon nitride, silsesquioxanes, polyimides, fluorinated polyimides, parylene, fluoro-polymers, poly (arylethers), fluorinated-poly(arylethers), porous-polymer/polyimides, polytetrafluoroethylene, and porous silica.

44. The interconnect structure of claim 22 wherein the low dielectric constant (low-k) material is selected from the group consisting of silicon, oxide ($SiO_2$), doped $SiO_2$, spin on glass (SOG), silicon nitride, silsesquioxanes, polyimides, fluorinated polyimides, parylene, fluoro-polymers, poly (arylethers), fluorinated-poly(arylethers), porous-polymer/polyimides, polytetrafluoroethylene, and porous silica.

\* \* \* \* \*